United States Patent
Lee

(10) Patent No.: US 9,647,579 B2
(45) Date of Patent: May 9, 2017

(54) ENERGY HARVESTING DEVICE, METHOD FOR MANUFACTURING THE SAME, AND WIRELESS DEVICE INCLUDING THE SAME

(71) Applicant: Electronics and Telecommunications Research Institute, Daejeon (KR)

(72) Inventor: Sang Kyun Lee, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 224 days.

(21) Appl. No.: 14/683,246

(22) Filed: Apr. 10, 2015

(65) Prior Publication Data

US 2016/0079885 A1    Mar. 17, 2016

(30) Foreign Application Priority Data

Sep. 11, 2014  (KR) .................. 10-2014-0120051

(51) Int. Cl.
*H01L 41/113* (2006.01)
*H02N 2/18* (2006.01)
*H02N 2/00* (2006.01)

(52) U.S. Cl.
CPC ......... *H02N 2/186* (2013.01); *H01L 41/1136* (2013.01); *H02N 2/22* (2013.01)

(58) Field of Classification Search
CPC ................................ H02N 2/18; H01L 41/113
USPC ........................................................ 310/339
See application file for complete search history.

(56) References Cited

U.S. PATENT DOCUMENTS

| | | | |
|---|---|---|---|
| 3,456,134 A * | 7/1969 | Ko ................... | A61N 1/3785 310/319 |
| 6,407,484 B1 | 6/2002 | Oliver et al. | |
| 6,700,310 B2 | 3/2004 | Maue et al. | |
| 7,687,977 B2 | 3/2010 | Xu | |
| 8,129,887 B2 * | 3/2012 | Mehraeen .......... | H01L 41/1136 310/319 |
| 8,723,398 B2 | 5/2014 | Lee | |
| 9,525,365 B2 * | 12/2016 | Katsumura ........ | H01L 41/1136 |
| 2007/0114890 A1 * | 5/2007 | Churchill ............ | H01L 41/1136 310/339 |
| 2008/0264537 A1 * | 10/2008 | Behrends ............. | B60C 23/041 152/152.1 |
| 2009/0079301 A1 * | 3/2009 | Grohmann .............. | B64C 3/48 310/332 |
| 2009/0284102 A1 * | 11/2009 | Karakaya ................ | F16F 15/02 310/321 |
| 2013/0154439 A1 * | 6/2013 | Lee ..................... | H01L 41/1136 310/314 |

(Continued)

FOREIGN PATENT DOCUMENTS

| | | | | |
|---|---|---|---|---|
| DE | 102010041200 A1 * | 3/2012 | ......... | H01L 41/1136 |
| DE | 102016201087 A1 * | 7/2016 | ........... | H01L 41/113 |
| WO | WO 2014021529 A1 * | 2/2014 | ......... | H01L 41/1136 |

*Primary Examiner* — J. San Martin
(74) *Attorney, Agent, or Firm* — Rabin & Berdo, P.C.

(57) ABSTRACT

Provided are an energy harvesting device, a method for manufacturing the same, and a wireless device including the same. The energy harvesting device may include a support body, a first cantilever connected to the support body, and an electricity generation layer on the first cantilever. The first cantilever may have a thickness that gradually increases in a direction that is away from the support body.

19 Claims, 6 Drawing Sheets

(56) References Cited

U.S. PATENT DOCUMENTS

2013/0313946 A1    11/2013  Lee et al.
2013/0320807 A1*   12/2013  Sakaguchi ............. H02N 2/188
                                                    310/339
2013/0342075 A1*   12/2013  Seddik ................ H01L 41/1136
                                                    310/323.01

* cited by examiner

ENERGY HARVESTING DEVICE, METHOD FOR MANUFACTURING THE SAME, AND WIRELESS DEVICE INCLUDING THE SAME

CROSS-REFERENCE TO RELATED APPLICATIONS

This U.S. non-provisional patent application claims priority under 35 U.S.C. §119 of Korean Patent Application No. 10-2014-0120051, filed on Sep. 11, 2014, the entire contents of which are hereby incorporated by reference.

BACKGROUND OF THE INVENTION

The present invention disclosed herein relates to an energy generation device and a method for manufacturing the same, and more particularly, to an energy harvesting device, a method for manufacturing the same, and a wireless device including the same.

In recent years, various kinds of electronic devices have appeared as telecommunication technologies are developed. For example, as electronic devices such as wireless electronic devices realize user centered ubiquitous computing, the needs of the electronic devices are explosively increasing. In general, such a wireless electronic device may include a portable power source such as a battery. Battery technologies have a limitation in that a battery is for one-time usage, or periodic charging of a battery is required. For that reason, an energy harvesting device installed in the wireless electronic devices is demanded.

For example, a self-powered wireless lighting switch may include the energy harvesting device. The energy harvesting device includes a piezoelectric element generating a power by vibration, sound, pressure, or deformation, and a non-piezoelectric element. The piezoelectric element is difficult to manufacture in various forms because it is solid and fragile. However, the non-piezoelectric element may be variously deformed in shape because it is formed of a metal material such as copper and aluminum.

SUMMARY OF THE INVENTION

The present invention provides an energy harvesting device that is capable of increasing an output power, a method for manufacturing the same, and a wireless device including the same.

The present invention also provides an energy harvesting device that is capable of preventing a piezoelectric layer from being damaged, a method for manufacturing the same, and a wireless device including the same.

Embodiments of the inventive concept provide energy harvesting devices including: a support body; a first cantilever connected to the support body; and an electricity generation layer on the first cantilever, wherein the first cantilever has a thickness that gradually increases in a direction that is away from the support body.

In some embodiments, the first cantilever may include a rounded first bottom surface that is concave upward.

In other embodiments, the support body may include: a support connected to the first cantilever; and a first base disposed under the support, wherein the first base includes a first top surface that is rounded to correspond to the first bottom surface, and the first top surface is convex upward.

In other embodiments of the inventive concept, wireless devices include: a housing; a printed circuit board disposed in the housing; a plurality of semiconductor chips mounted on the printed circuit board; and an energy harvesting device supplying a power to the semiconductor chips, wherein the energy harvesting device includes: a support body; a first cantilever connected to the support body; and an electricity generation layer on the first cantilever, wherein the first cantilever has a thickness that gradually increases in a direction that is away from the support body.

In still other embodiments of the inventive concept, methods include: providing a first cantilever to a support body; and forming an electricity generation layer on the first cantilever, wherein the support body includes: a first base below the first cantilever; and a support formed on one side of the first base, the support being connected to the first cantilever, wherein the first cantilever has a thickness that gradually increases in a direction that is away from the support.

BRIEF DESCRIPTION OF THE DRAWINGS

The accompanying drawings are included to provide a further understanding of the present invention, and are incorporated in and constitute a part of this specification. The drawings illustrate exemplary embodiments of the inventive concept and, together with the description, serve to explain principles of the present invention. In the drawings.

DETAILED DESCRIPTION OF PREFERRED EMBODIMENTS

Figure 1:
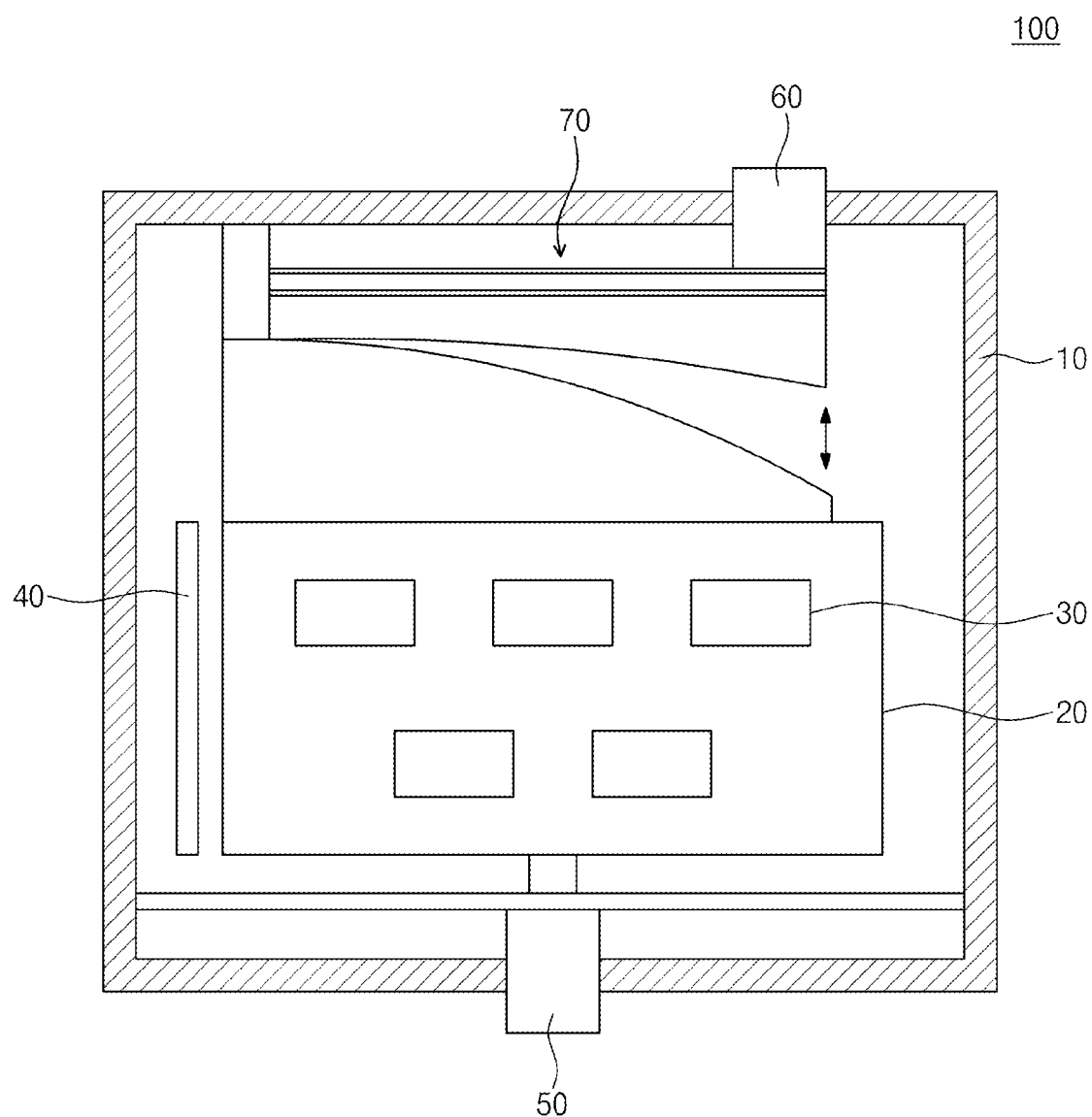
FIG. 1 is a plan view of a self-powered wireless switch according to an embodiment of the inventive concept.

Hereinafter, exemplary embodiments of the inventive concept will be described in detail with reference to the accompanying drawings. Advantages and features of the present invention, and implementation methods thereof will be clarified through following embodiments described with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the present invention to those skilled in the art. Further, the present invention is only defined by scopes of claims. Like reference numerals refer to like elements throughout.

In the following description, the technical terms are used only for explaining a specific exemplary embodiment while not limiting the present invention. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

FIG. 1 shows a self-powered wireless device according to an embodiment of the inventive concept. The wireless device according to the present invention may be a self-powered wireless lighting switch. According to an example, the wireless device may include a housing 10, a printed circuit board 20, semiconductor chips 30, an antenna 40, a first push button 50, a second push button 60, and an energy harvesting device 70. The housing 10 may have a rectangular shape. The printed circuit board 20 may be disposed within the housing 10. The semiconductor chips 30 may be mounted on the printed circuit board 20. The semiconductor chips 30 may generate a wireless control signal. The antenna 40 may transmit or receive the wireless control signal. The first push button 50 may generate a turn-on signal. The turn-on signal may be a turn-on switching signal of a lighting disposed outside the housing 10. The second push button 60 is a button for pushing the energy harvesting device 70. According to an example, the first push button 50 and the second push button 60 may be disposed on both facing sides of the housing 10, respectively. This is done because the first push button 50 and the second push button 60 are simultaneously operated by using one hand of a user. The energy harvesting device 70 may generate a power and supply the generated power to the semiconductor chips 30.

Hereinafter, embodiments of the energy harvesting device 70 will be described.

Figure 2:
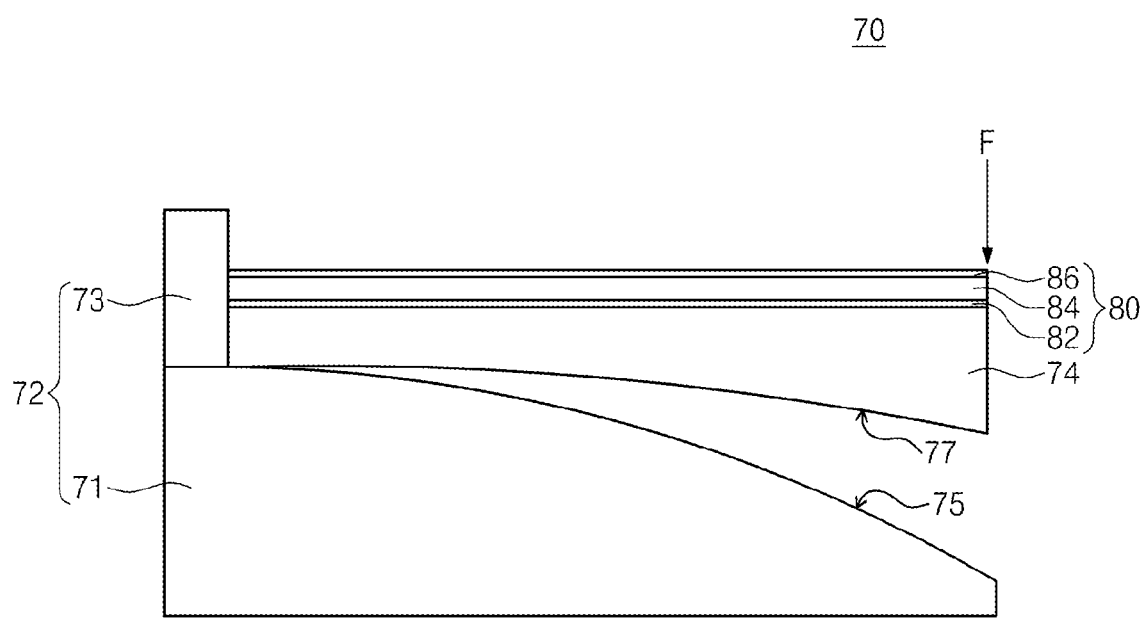
FIG. 2 is a view of an energy harvesting device according to an embodiment of the inventive concept.

FIG. 2 illustrates an energy harvesting device 70 according to an embodiment of the inventive concept.

According to an embodiment of the inventive concept, the energy harvesting device 70 may include a support body 72, a first cantilever 74, and electricity generation layers 80.

The support body 72 may be fixed to an inner wall of the housing 10. According to an example, the support body 72 may include a first base 71 and a support 73. The first base 71 may fix the support 73. The first base 71 may have one side higher than the other side thereof. According to an example, the first base 71 may have a first top surface 75. The first top surface 75 may be convex upward. The support 73 may be disposed on a side of the first base 71.

The first cantilever 74 may be connected to the support body 72. According to an example, the first cantilever 74 may be connected to the support 73. The first cantilever 74 may have a thickness that gradually increases in a direction that is away from the support 73. According to an example, a first bottom surface 77 of the first cantilever 74 may have the same shape as the upper surface 75 of the first base 71. For example, the first bottom surface 77 is concave upward.

The electricity generation layers 80 may be disposed on the first cantilever 74. According to an example, the electricity generation layers 80 may include a first electrode layer 82, a piezoelectric layer 84, and a second electrode layer 86. Each of the first electrode layer 82 and the second electrode layer 86 may include a metal layer. The piezoelectric layer 84 may be disposed between the first electrode layer 82 and the second electrode layer 86. The piezoelectric layer 84 may include PZT. The piezoelectric layer 84 may generate a power when the first cantilever 74 is bent.

An external force F may be applied to the other side of the first cantilever 74 through the second push button 60. The first cantilever 74 may gradually contact the first base 71 from a thin portion to thick portion thereof. The first cantilever 74 may have one side gradually coupled to the other side. The first cantilever 74 may be stably bent along the first top surface 75 of the first base 71. Accordingly, the electricity generation layers 80 on the first cantilever 74 may be prevented from being damaged.

When the external force F is removed, the first cantilever 74 may be separated from the first base 71. The first cantilever 74 may be self-vibrated. This is done because the other side of the first cantilever 74 acts as a tip mass. The electricity generation layer 80 on the first cantilever 74 may generate a power. The output power may increase by the self-vibration of the first cantilever 74.

A method for manufacturing the energy harvesting device 70 including the above-described constitutions according to an embodiment of the inventive concept will be described as follows.

Figure 3:
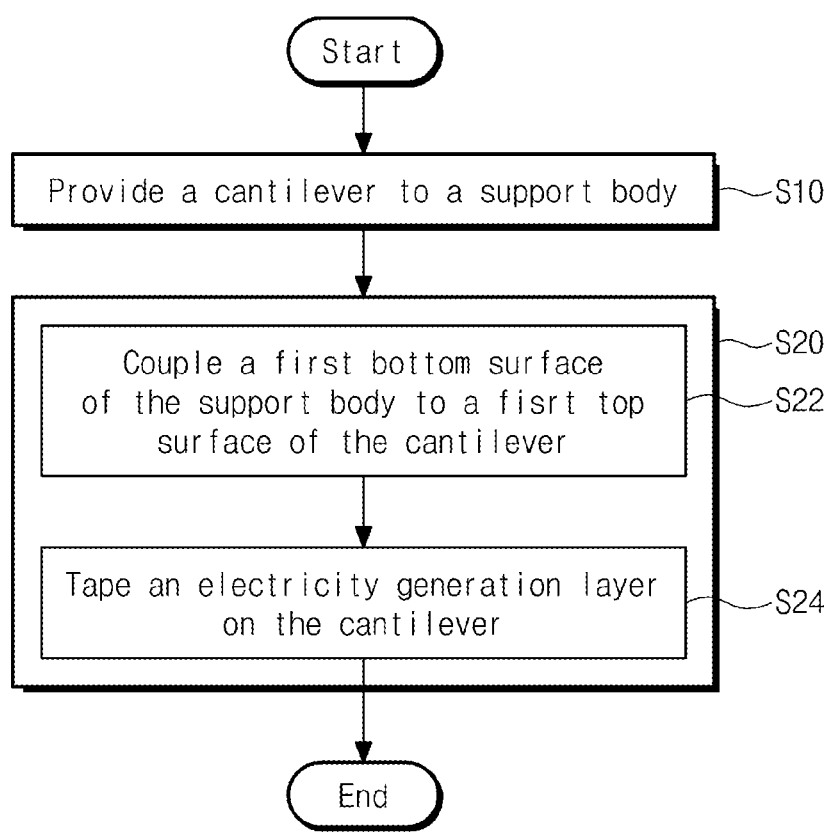
FIG. 3 is a flowchart illustrating a method for manufacturing the energy harvesting device according to an embodiment of the inventive concept.

FIG. 3 shows the method for manufacturing the energy harvesting device 70 according to an embodiment of the inventive concept. Firstly, in operation S10, a first cantilever 74 is provided to a support body 72. The support body 72 and the first cantilever 74 may be formed through a 3-D printing method or metal casting method. The support body 72 and the first cantilever 74 may be separately formed and then coupled to each other, or integrally formed with each other.

Next, in operation S20, an electricity generation layer 80 may be formed on the first cantilever 74. The process (S20) of forming the electricity generation layer 80 may include a process (S22) of coupling a first top surface 75 of a first base 71 to a first bottom surface 77 of the first cantilever 74, and a process (S24) of taping the electricity generation layer 80 on the first cantilever 74. When the first cantilever 74 descends by an external force, the first top surface 75 and the first bottom surface 77 may be coupled in the operation S22. The first top surface 75 and the first bottom surface 77 may be fixed to each other by using a clamp or adhesive. In the operation S24, the electricity generation layer 80 may be taped on the first cantilever 74 by a transferring method.

Figure 4:
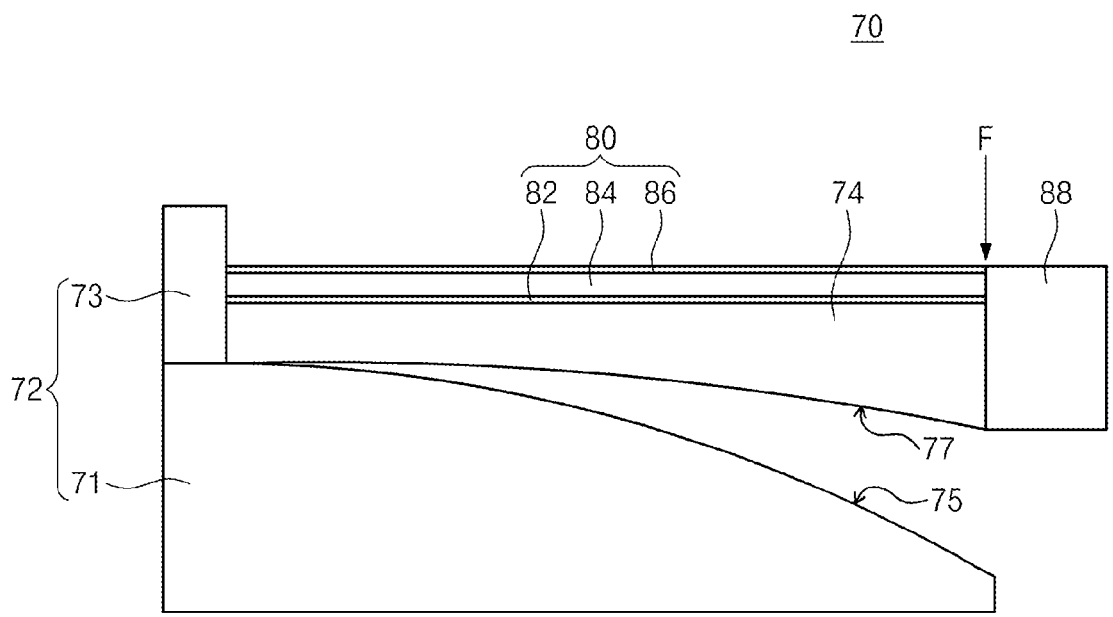
FIG. 4 is a view of an energy harvesting device according to another embodiment of the inventive concept.

FIG. 4 illustrates an energy harvesting device 70 according to another embodiment of the inventive concept. According to another embodiment of the inventive concept, the energy harvesting device 70 may include an additional mass 88. The additional mass 88 may be coupled to the other side of the first cantilever 74. The additional mass 88 may increase a vibration time of the first cantilever 74. In another embodiment, the additional mass coupled to the other end of the first cantilever 74 of the foregoing embodiment may be further provided.

Figure 5:
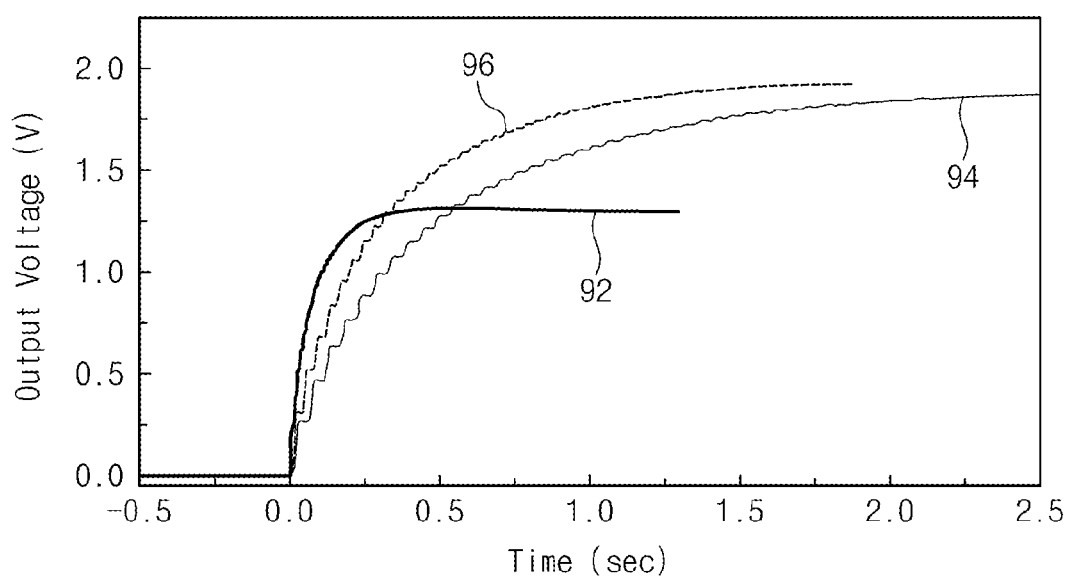
FIG. 5 is a graph illustrating an output voltage according to a weight of an additional mass.

FIG. 5 illustrates an output voltage according to a weight of the additional mass 88. The more the weight of the additional mass 88 increases, the more the output voltage may increase. For example, when the additional mass 88 does not exist (see a line 92 of FIG. 5), the energy harvesting device 70 may generate the output voltage of about 1.25 V. When the additional mass 88 has a weight of about 17 g (see a line 94 of FIG. 5), the energy harvesting device 70 may generate the output voltage of about 1.85V. When the additional mass 88 has a weight of about 34 g (see a line 96 of FIG. 5), the energy harvesting device 70 may generate the output voltage of about 1.9V.

Figure 6:
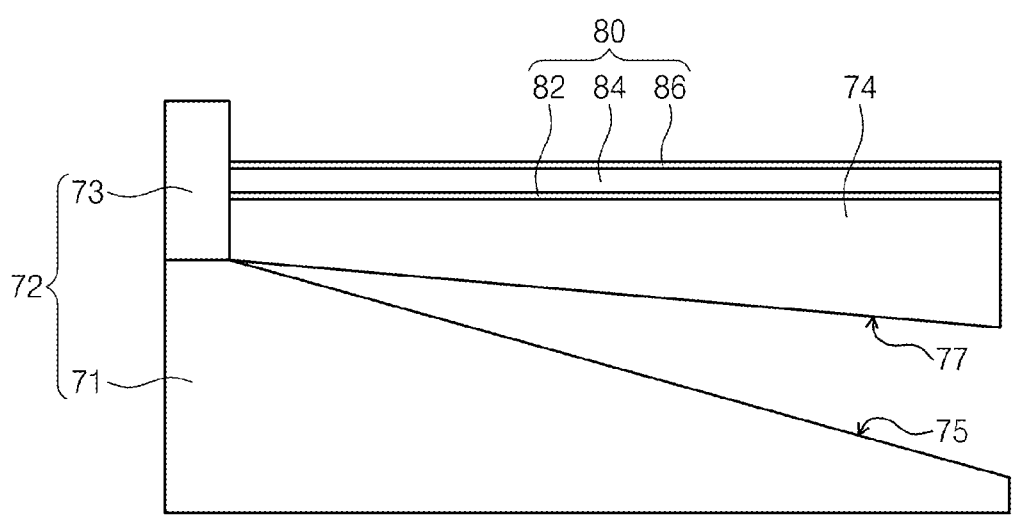
FIG. 6 is a view of an energy harvesting device according to further another embodiment of the inventive concept.

FIG. 6 illustrates an energy harvesting device 70 according to further another embodiment of the inventive concept. According to further another embodiment of the inventive concept, the energy harvesting device 70 may include a first base 71 having an inclined first top surface 75, and a first cantilever 74 having an inclined first bottom surface 77. When the first cantilever 74 is pushed, the first top surface 75 and the first bottom surface 77 may contact each other in an inclined direction. In further another embodiment, the first base 71 and the first cantilever 74 according to the foregoing embodiment have the inclined first top and bottom surfaces 75 and 77.

Figure 7:
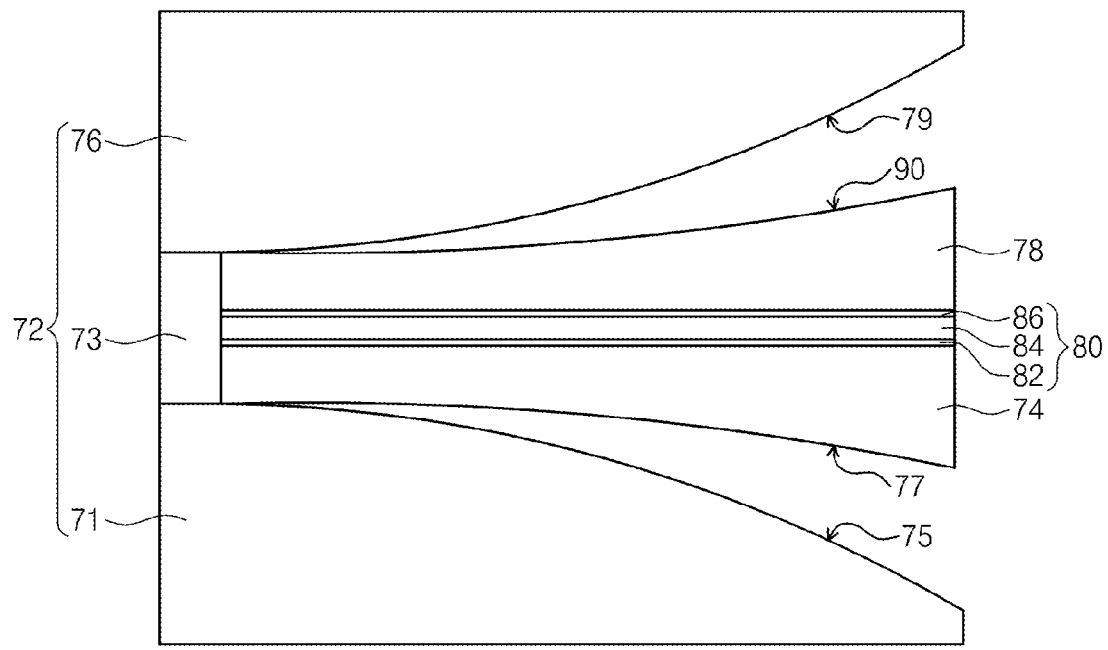
FIG. 7 is a view of an energy harvesting device according to an exemplary embodiment of the inventive concept.

FIG. 7 illustrates an energy harvesting device 70 according to an exemplary embodiment of the inventive concept. According to the exemplary embodiment of the inventive concept, the energy harvesting device 70 may include a second base 76 and a second cantilever 78.

The second base 76 may be disposed opposite to the first base 71. One side of the second base 76 may be a support body 72 fixed on a support 73. The second base 76 may have a rounded second bottom surface 79. The second bottom surface 79 may convex downward. Although not shown, the second base 76 may be fixed within the housing 10.

The second cantilever 78 may be disposed on the first cantilever 74. An electricity generation layers 80 may be disposed between the first cantilever 74 and the second cantilever 78. The second cantilever 78 may be connected to the support 73. The second cantilever 78 may extend from the support 73 onto the first cantilever 74. The second cantilever 78 may have a thickness that gradually increases in a direction that is away from the support 73. The second cantilever 78 may have a second upper surface 90 contacting the second bottom surface 79. The second top surface 90 may be concave downward.

The exemplary embodiment includes the second base 76 and the second cantilever 74 which are disposed symmetrical to the first base 71 and the first cantilever 73 according to the foregoing embodiment.

As described above, the energy harvesting device according to the Embodiments of the inventive concept may include the support body, the first cantilever, and the electricity generation layer on the first cantilever. The support body may include the support fixing the first cantilever and the base having the top surface that is rounded to correspond to the first cantilever. When an external force is applied, since the first cantilever is stably bent along the rounded top surface, the electricity generation layer may be prevented from being damaged. When the external force is removed, the first cantilever may be separated from the first base and self-vibrated. The output power of the electricity generation layer may increase by the self-vibration of the first cantilever.

The description of the present invention is intended to be illustrative, and those with ordinary skill in the technical field of the present invention will be understood that the present invention can be carried out in other specific forms without changing the technical idea or essential features. Therefore, the embodiments described above include exemplary in all respects and not restrictive, but it should be understood.

What is claimed is:

1. A energy harvesting device, comprising:
a support body;
a first cantilever connected to the support body; and
an electricity generation layer on the first cantilever,
wherein the first cantilever has a thickness that gradually increases in a direction that is away from the support body.

2. The energy harvesting device of claim 1, wherein the first cantilever comprises a first bottom surface that is concave upward.

3. The energy harvesting device of claim 2, wherein the support body comprises:
a support connected to the first cantilever; and
a first base disposed under the support,
wherein the first base comprises a first top surface that is rounded to correspond to the first bottom surface, and the first top surface is convex upward.

4. The energy harvesting device of claim 3, further comprising a second cantilever extending from the support onto the first cantilever,
wherein the second cantilever has a thickness that gradually increases in a direction that is away from the support body.

5. The energy harvesting device of claim 4, wherein the second cantilever comprises a rounded second top surface that is concave downward.

6. The energy harvesting device of claim 5, wherein the support body further comprises a second base disposed on the support to face the first base and having a second bottom surface rounded to correspond to the second top surface,
wherein the second base is convex downward.

7. The energy harvesting device of claim 4, wherein the electricity generation layer comprises a piezoelectric layer disposed between the first cantilever and the second cantilever.

8. The energy harvesting device of claim 7, wherein the electricity generation layer further comprises:
a first electrode layer between the first cantilever and the piezoelectric layer; and
a second electrode layer between the piezoelectric layer and the second cantilever.

9. The energy harvesting device of claim 1, wherein the first cantilever has a mass that gradually increases in a direction that is away from the support body.

10. The energy harvesting device of claim 1, further comprising a mass connected to an end of the first cantilever facing the support.

11. The energy harvesting device of claim 1, wherein the first cantilever comprises an inclined first bottom surface.

12. The energy harvesting device of claim 11, wherein the support body comprises:
a support connected to the first cantilever; and
a first base for allowing the support to stand up in a direction perpendicular to the first cantilever,
wherein the first base comprises a first top surface that is inclined to correspond to the inclined first bottom surface.

13. A wireless device, comprising:
a housing;
a printed circuit board disposed in the housing;
a plurality of semiconductor chips mounted on the printed circuit board; and
an energy harvesting device supplying a power voltage to the semiconductor chips,
wherein the energy harvesting device comprises:
a support body;
a first cantilever connected to the support body; and
an electricity generation layer on the first cantilever,
wherein the first cantilever has a thickness that gradually increases in a direction that is away from the support body.

14. The wireless device of claim 13, wherein the support body is fixed to the housing, and
the support body further comprises a first push button pushing the first cantilever.

15. The wireless device of claim 13, further comprising:
a second push button generating a turn-on signal; and
an antenna transmitting a wireless control signal according to the turn-on signal,
wherein the first push button and the second push button are disposed on both facing sides of the housing, respectively.

16. A method for manufacturing an energy harvesting device, the method comprising:

providing a first cantilever to a support body; and forming an electricity generation layer on the first cantilever, wherein the support body comprises:

a first base below the first cantilever; and a support formed on one side of the first base, the support being connected to the first cantilever, wherein the first cantilever has a thickness that gradually increases in a direction that is away from the support.

17. The method of claim 16, wherein the first cantilever comprises a rounded first bottom surface, and the first base comprises a rounded first top surface facing the rounded first bottom surface, wherein the forming of the electricity generation layer comprises:

coupling the first bottom surface to the first top surface; and forming the electricity generation layer on the first cantilever.

18. The method of claim 17, wherein the electricity generation layer is taped on the first cantilever layer.

19. The method of claim 16, further comprising:

providing the first cantilever;

coupling the first cantilever to the support; and connecting the support to the first base.

\* \* \* \* \*